United States Patent [19]
Harron et al.

[11] Patent Number: 6,064,285
[45] Date of Patent: May 16, 2000

[54] PRINTED CIRCUIT BOARD HELICAL RESONATOR AND FILTER APPARATUS

[75] Inventors: Gerald D. Harron, Martensville; Surinder G. Kumar, Victoria, both of Canada

[73] Assignee: Wavecom Electronics Inc, Canada

[21] Appl. No.: 09/209,295

[22] Filed: Dec. 11, 1998

[51] Int. Cl.[7] .................................................. H01P 1/20
[52] U.S. Cl. ......................................... 333/202; 333/177
[58] Field of Search .................................. 333/177, 180, 333/184, 185, 202; 336/200

[56] References Cited

U.S. PATENT DOCUMENTS

| | | | |
|---|---|---|---|
| 2,854,642 | 9/1958 | Boothe | 333/180 |
| 3,820,045 | 6/1974 | Igarashi | 333/185 |
| 3,992,691 | 11/1976 | Molthen | 336/200 |
| 4,429,289 | 1/1984 | Higgins, Jr. et al. | 333/202 X |
| 4,682,131 | 7/1987 | May . | |
| 4,897,623 | 1/1990 | Reindel . | |
| 4,990,870 | 2/1991 | Reindel . | |
| 4,990,871 | 2/1991 | Reindel . | |
| 5,036,301 | 7/1991 | Takao et al. . | |
| 5,202,699 | 4/1993 | Hemmie et al. . | |
| 5,343,176 | 8/1994 | Hasler . | |
| 5,392,020 | 2/1995 | Chang | 336/200 |

FOREIGN PATENT DOCUMENTS

| | | | |
|---|---|---|---|
| 58-80805 | 5/1983 | Japan | 336/200 |
| 58-157109 | 9/1983 | Japan | 336/200 |
| 60-140901 | 7/1985 | Japan | 333/202 HC |

*Primary Examiner*—Justin P. Bettendorf
*Attorney, Agent, or Firm*—Terry Leier; Blake, Cassels & Graydon LLP

[57] ABSTRACT

A filter described which includes helical resonator elements constructed using printed circuit board (PCB) materials and fabrication techniques. A helical resonator element is formed from conductive traces on either side of a double sided PCB substrate with interconnection of the traces using plated through holes to form a three dimensional serpentine or helical conductor path. Multiple resonator elements are RF coupled using ferromagnetic coupling elements. The shape and number of the coupling elements may be selected to control RF coupling between resonator elements and the tuning of the filter.

12 Claims, 3 Drawing Sheets

PRINTED CIRCUIT BOARD HELICAL RESONATOR AND FILTER APPARATUS

BACKGROUND OF THE INVENTION

The present invention generally relates to helical inductors, particularly resonator helical filters and more particularly to RF helical filter arrangements formed using printed circuit board techniques.

RF helical filter apparatus incorporating one or more helical resonators are known in the art. Typically, these filter arrangements include a plurality of resonators constructed from conductors forming helical coils. The resonator coils encircle a cylindrical space. The helical coils are mounted on a suitable base plate which spacedly disposes the resonator helical coils. The coils themselves are connected to electrical ground at one end and a signal tap lead to connected to the helical coil at a selected tap point. Frequently, a tuning slug is provided to change the electrical characteristics of the coil to tune the filter. When provided, the tuning slug is generally threadably received in the upper portion of the helical coil distal from the mounting plate. The tuning slug is rotated to axially displace the tuning slug with respect to the helical coil to change the tuning of the coil.

The coils themselves are formed from a wire material to extend in a helical fashion. Where a tuning slug is used, the tuning slug is dimensioned to be received in the cavity or bore centrally formed by the helically disposed wire coil. Commonly, helical filter arrangements have three resonator coils encased within a shielding case or can to contain the radio frequency (RF) signal radiation emanating from each coil. The shielding case includes a baffle structure forming a contiguous box structure to encase each resonator coil separately. The baffle structure provides an aperture in the common wall of the box cavities encasing each of the separate resonator coils to permit RF coupling to occur between adjacent resonator coils. The shape and size of the aperture is configured to control the RF coupling between each coil. In a three coil filter arrangement, the central resonator is RF coupled to two end resonators by apertures in the common side walls contained within the overall shielding can that encloses the resonator apparatus. The end resonators are connected to a tap lead that extends from the helical coil to a signal conductor trace formed on the printed circuit board to supply signalling to or receive signalling from the resonator filter. Each tap point associated with a helical resonator is selected to provide an impedance match to the circuit to which the filter arrangement is to be electrically connected.

Heretofore, construction of resonator filter helical coils required the supply of a relatively large gauge wire which is wrapped in a helix forming device and then cut to form the helical resonator. Such a construction method has several disadvantages including the need to provide wire of a structural dimension to form the helical resonator. Also, forming equipment is needed to wrap and bend the wire and cut and configure it into a helical structure for use in the resonator.

The complexity and cost of producing printed circuit board assemblies incorporating RF helical filter resonators could be reduced if the need for relatively large gauge formed wire could be eliminated. Furthermore, the cost of producing printed circuit board assemblies that include RF helical filter resonators could be reduced if the need for wire forming equipment to form wire helix structures could be eliminated. Accordingly, there exists the need for construction of helical resonators which do not require the supply of wire of a relatively large dimension to form the structure of helical coils. Moreover, there exists a need to fabricate helical coils without the requirement to have wire forming apparatus to bend wire into a helical structure to form the resonator.

SUMMARY OF THE INVENTION

The present invention provides a helical filter apparatus which is constructed using printed circuit board techniques and materials. In accordance with the invention, a helical filter resonator is fabricated using the equipment, materials and production methods as used to produce a printed circuit board assembly. In accordance with the manner of construction of a helical filter using the principles of the present invention, the need to provide wire having structural capabilities to construct the helical resonators in filter is eliminated. Moreover, with the present invention, helical resonant filters can be produced yet the need to provide equipment to form wire into a helical configuration is eliminated.

In another aspect of the invention, an RF filter arrangement constructed from resonators fabricated in accordance with the invention have a shielding can enclosing the filter assembly which has a single cavity eliminating the need or requirement for inner walls to form apertures to control the RF coupling between adjacent helical resonators.

In another aspect of the invention, adjacent resonators have one or more magnetizable elements interposed therebetween to control the RF coupling between adjacent resonators. The shape, mass and positioning of the magnetizable elements are selected to obtain the desired RF coupling to facilitate operation of the filter in accordance with the requirements of the application in which the filter will be incorporated.

These and other objects and advantages of the present invention will become apparent to those skilled in the art in the context of the present invention as described in the specification, drawings and claims herein. Referring to the drawings, like reference numerals identify like features of the invention in the several figures throughout. The preferred embodiments of the invention will now be described with reference to the drawings in which:

DETAILED DESCRIPTION OF THE PREFERRED EMBODIMENT

Figure 1:
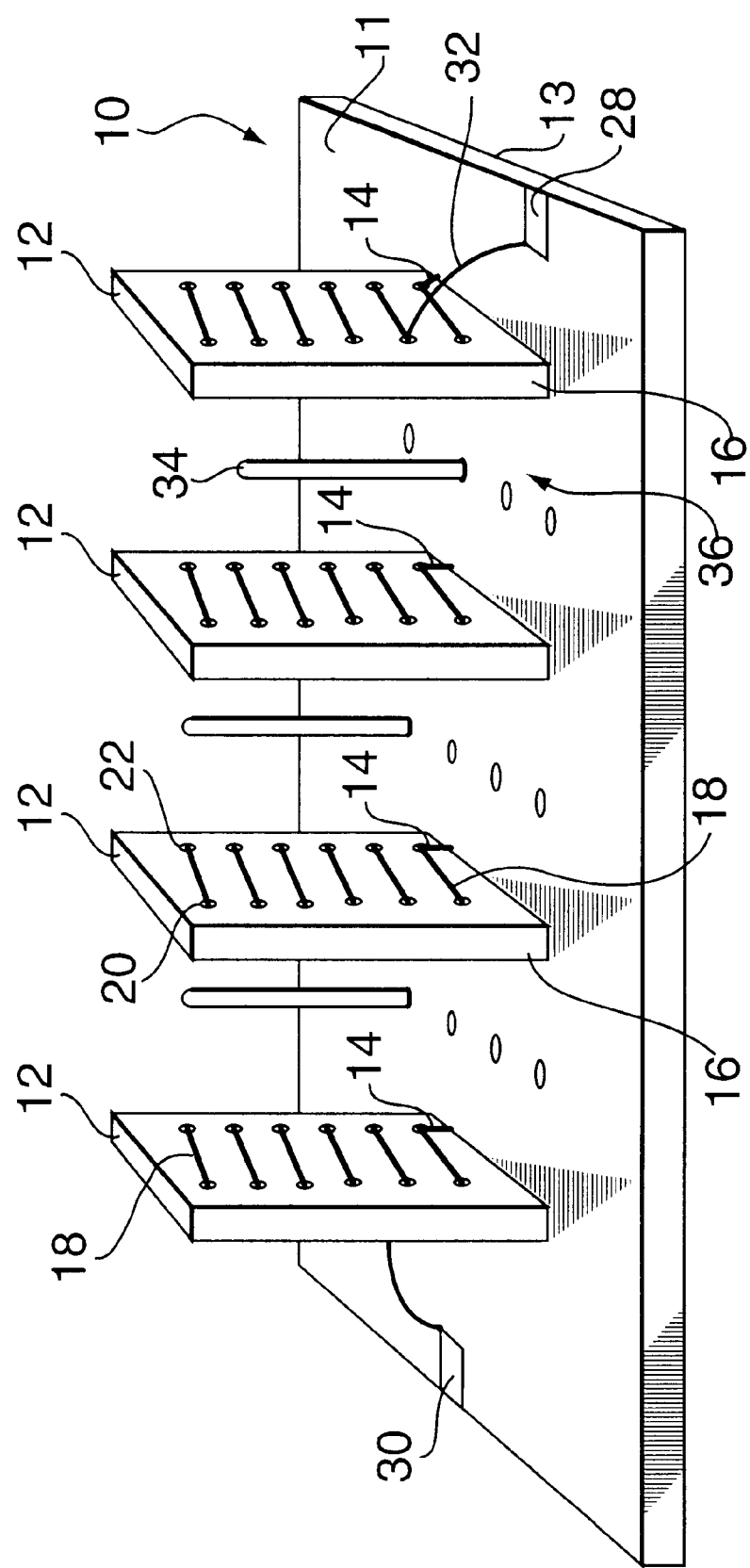
FIG. 1 is a perspective view of helical filter apparatus constructed in accordance with the invention.

FIG. 1 shows a four resonator filter assembly constructed in accordance with the principles of present invention and designated generally by reference numeral 10. Each resonator 12 is constructed in accordance with the principles of invention and it should be understood that is not necessary that the structural features of each of the helical resonators be identical. A printed circuit board 11 forms a base upon which resonator structures 12 are mounted to extend vertically therefrom. The base supports a conductive surface forming a ground plane 13 which cooperates with overall shielding can 43 (shown in FIG. 3) to enclose the RF electromagnetic radiation emanating from the resonators 12 to confine the RF radiation within the cavity formed by shielding can 43 and ground plane 13. Extending from ground plane 13 are ground leads 14 electrically coupling the one end of the resonator to ground.

Each resonator 12 is formed on printed circuit board (PCB) substrate material 16. In the preferred embodiment of the invention, each side of board 16 is provided with a plurality of elongate conductive traces 18 extending between rows of apertures 20 and 22. The rows of apertures 20 and 22 are preferably constructed as holes drilled through the PCB substrate 16. The elongate conductive traces 18 extend between the apertures such that a conductor extending from aperture "N" in row 20 extend to aperture "N" in row 22. The reverse side of the printed circuit board 16 has elongate conductive traces that are inclined such that a trace extending from aperture "N" in row 20 extents to or interconnects with aperture "N+1" in row 22.

For RF filter assemblies, it is necessary for each of the resonators to couple to the adjacent resonator to pass the signal to be filtered from the input lead 28 to the signal output lead 30. In the RF filter depicted in FIG. 1, four resonator coils are provided. The signal from the input lead 28 is supplied to the first resonator coil by means of an input tap line 32. Input tap line 32 extends from the signal input lead to a predetermined location on the "helix" of the first resonator coil, the location is selected to provide an impedance match to the circuitry supplying the input signal. As previously noted, one end of the resonator coil is provided with a ground tap 14 which completes the signal supply circuit for the input signal arriving at the resonator on input tap line 32. The presence of an input signal on input supply line 28 causes an electromagnetic (EM) field to be produced in the interior volume of the resonator "helix" which extends to the space surrounding the resonator in accordance with well understood principles of EM fields. The EM coupling with the next adjacent resonator can be controlled by provision of a ferromagnetic element. Each ferromagnetic element is preferably in the form of a wire to allow the specification of the EM coupling behaviour by parameters such as wire material, wire gauge and wire length. While only one ferromagnetic element 34 is shown between each adjacent resonator coil, it will be understood that more than one ferromagnetic element 34 may be provided there between. For example, the PCB substrate 11 in FIG. 1 has four mounting holes 36 shown between each resonator to allow up to four ferromagnetic elements to be positioned between adjacent resonators. As will be understood by those versed in the art, these ferromagnetic elements control the filter tuning and response. The interconnection between traces 18 through the printed circuit board is best explained with reference to the cross-section shown in FIG. 2. Another factor which controls filter timing and response is the inductance of each of the helical resonators. The inductance of each resonator can be controlled by (1) the thickness of the printed circuit board 16 material
(2) the spacing of the traces 18 and 24 (shown in FIG. 2), and
(3) the number of loops or turns of the traces on the printed circuit board forming the resonation 12.

Figure 2:
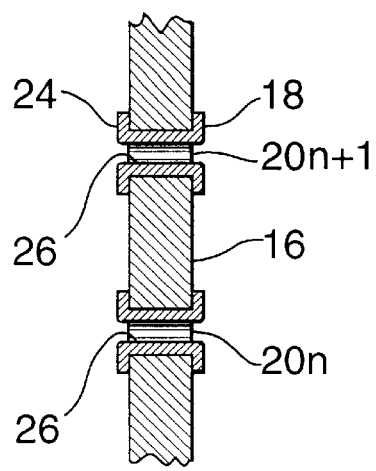
FIG. 2 is a cross-section of one of the helical resonators of FIG. 1.

Referring to FIG. 2, PCB substrate 16 forms a non-conducting structure onto which the elongate conductive traces 18 and through which communicating apertures in the form of drilled through holes are provided. By way of example, two apertures from row 20 are shown in FIG. 2, namely, 20N and 20N+1. Each of the apertures forming rows 20 and 22 are provided to enable an electrical conductor to extend from the front surface of the PCB substrate to the back surface. By way of example, one end of elongate trace 18 is interconnected with one end of reverse side elongate trace 24 by an aperture which is provided to facilitate plated-through conductor 26 to interconnect these traces to form a loop or winding. Each adjacent loop is connected in similar fashion with plated through conductor at the other end of the elongate traces. In this fashion interconnected loops formed and interconnected as described provide an inductor which extends in a substantially "helical" manner to form an inductor or resonator. In an RF filter assembly, multiple resonators are spacedly mounted on PCB 11 to extend upwardly from the base PCB 11 to form a helical resonator filter assembly.

Figure 3:
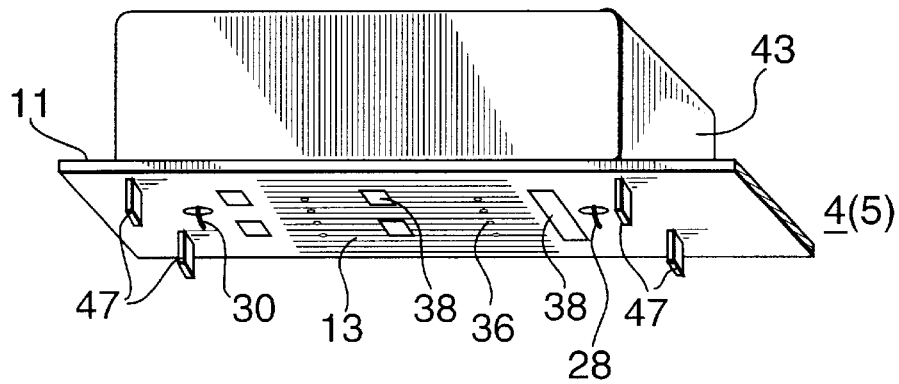
FIG. 3 is a perspective view of a shielding can which is used to enclose the helical resonators.

FIG. 3 shows a bottom perspective view of a portion of a printed circuit board 11 incorporating the helical filter construction of the present invention. The helical resonators are encased in an enclosure shielding can 43 which is a structure that is impervious or opaque to or substantially attenuates EM fields. Typically enclosure can 43 will be constructed of a metal conductor. The enclosure shielding can 43 is used to contain the RF radiation emanating from resonators 12 (of FIG. 1). To complete the RF enclosure structure, the PCB surface below the enclosure shielding can 43 is conventionally provided with a grounding plane 13 that is electrically connected to the enclosure shielding can 43 itself by means of several tabs 47 extending from and generally forming part of enclosure can 43. Such tabs are soldered to the PCB ground plane 13 to provide physical means to attach the enclosure shielding can 43 to the PCB board 11 as well as provide electrical connection to ground plane 13. Also shown in FIG. 3 are resonator mounting slots 38 which are used to provide a physical mounting system for mounting resonators 12 on PCB board 11. Any one of several means can be used to mount the resonators on the PCB board 11 including gluing or providing a metal shoe on the lower portion of the resonator structure which can be soldered to the ground plane 13 of the PCB board 11. By way of example, there are two configurations of mounting slots 38 shown, namely, a single slot arrangement and a slot pair arrangement.

Figure 3A:
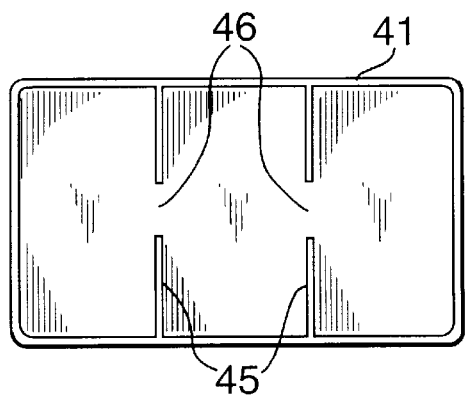
FIG. 3a is a bottom plan view of a prior art shielding can.
Figure 3B:
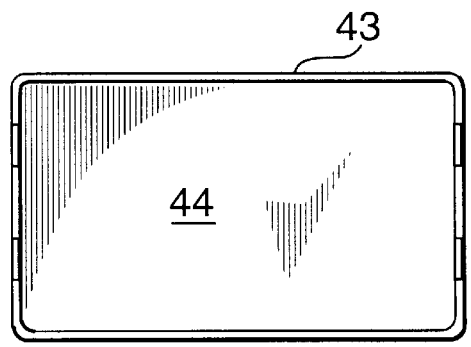
FIG. 3b is a bottom plan view of a shielding can constructed in accordance with advantages of the present invention.

A bottom plan view of the enclosure shielding can 43 of the present invention is shown in FIG. 3b. In accordance with the invention, shielding can 43 is constructed to provide a single internal cavity 44 to enclose all of the resonators provided in the RF filter. FIG. 3a shows the construction of prior art RF shielding can enclosures at 41. Prior art shielding cans or enclosures provide common walls forming communicating apertures 46 for RF coupling of each resonator coil to the next. Such internal common walls are not needed in the construction of the RF filter assemblies of the present invention thereby simplifying the construction of the shielding can enclosures to the structure shown in FIG. 3b.

Figure 4:
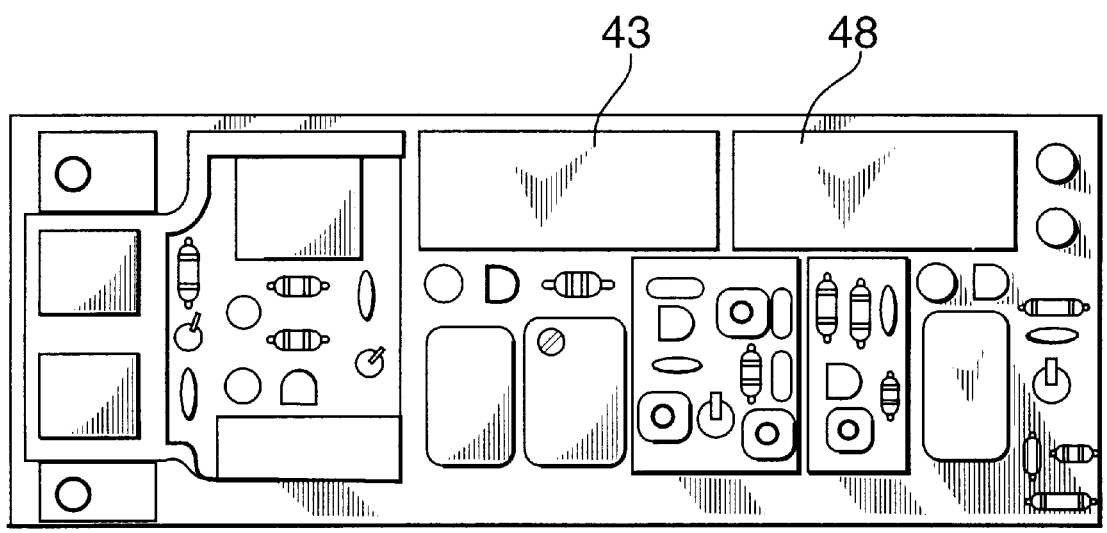
FIG. 4 is a plan view of a printed circuit board assembly including the inventive helical filter apparatus.

FIG. 4 shows a plan view of a printed circuit board assembly incorporating two RF filters 43 and 48 to illustrate incorporation of the filter assemblies of the present invention into a printed circuit board assembly.

While the invention has be disclosed with reference to the description and drawings hereof, it will be apparent to those skilled in the art that many modifications and substitutions may be made to the specific embodiments herein described without departing from the spirit and scope of the invention as defined in the claims appended hereto.

What is claimed is:

1. RF filter apparatus comprising:

(a) at least two resonator inductors each spacedly disposed from another, each said resonator comprising:

(i) an electrically non-conductive substrate;

(ii) a circuit printed on said substrate to provide at least one electrical loop conductive trace circumscribing a volumetric portion of said substrate; and (b) at least one magnetizable element interposed between an adjacent pair of said resonators to influence the electromagnetic coupling there between.

2. RF filter apparatus as claimed in claim 1 wherein said substrate is a substantially planar element forming flat opposed first and second surfaces.

3. RF filter apparatus as claimed in claim 2 wherein each said electrical loop comprises:

(i) an elongate conductive trace on said first surface;

(ii) an elongate conductive trace on said second surface; and (iii) a conductor passing through an aperture formed in said non-conducting substrate to interconnect one end of each said elongate conductive traces.

4. RF filter apparatus as claimed in claim 3 further including a connecting conductor passing through an aperture formed in said non-conducting substrate for each pair of electrical loops to interconnect said electrical loops to form a substantially helical inductor.

5. RF filter apparatus as claimed in claim 4 wherein each said electrical loop is a conductive trace extending substantially helically along the surface of said non-conductive substrate.

6. The RF filter apparatus of claim 1 further including a RF shield to surround said resonators and said at least one magnetizable element.

7. RF filter apparatus comprising:

(a) a base;

(b) at least two resonator inductors spacedly mounted on and perpendicular to said base, each said resonator comprising:

(i) an electrically non-conductive substrate;

(ii) a circuit printed on said substrate to provide at least one electrical loop conductive trace circumscribing a volumetric portion of said substrate; and (b) at least one magnetizable element interposed between an adjacent pair of said resonators to influence the electromagnetic coupling there between.

8. RF filter apparatus as claimed in claim 7 wherein said substrate is a substantially planar element forming flat opposed first and second surfaces.

9. RF filter apparatus as claimed in claim 8 wherein each said electrical loop comprises:

(i) an elongate conductive trace on said first surface, (ii) an elongate conductive trace on said second surface; and (iii) a conductor passing through an aperture formed in said non-conducting substrate to interconnect one end of each said elongate conductive traces.

10. RF filter apparatus as claimed in claim 9 further including a connecting conductor passing through an aperture formed in said non-conducting substrate for each pair of electrical loops to interconnect said electrical loops to form a substantially helical inductor.

11. RF filter apparatus as claimed in claim 10 wherein each said electrical loop is a conductive trace extending substantially helically along the surface of said non-conductive substrate.

12. The RF filter apparatus of claim 7 further including an RF shield to surround said resonators and said at least one magnetizable element.

* * * * *